(12) United States Patent
Gijsbertsen et al.

(10) Patent No.: US 7,390,614 B2
(45) Date of Patent: Jun. 24, 2008

(54) LITHOGRAPHIC APPARATUS AND DEVICE MANUFACTURING METHOD

(75) Inventors: Johannes G. Gijsbertsen, Delft (NL); Pieter W. H. De Jager, Rotterdam (NL); Michiel D. Nijkerk, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 450 days.

(21) Appl. No.: 11/091,905

(22) Filed: Mar. 29, 2005

(65) Prior Publication Data

US 2005/0186509 A1    Aug. 25, 2005

Related U.S. Application Data

(62) Division of application No. 10/356,727, filed on Feb. 3, 2003.

(30) Foreign Application Priority Data

Feb. 6, 2002    (EP) .................................. 02250786

(51) Int. Cl.
*G03F 9/00* (2006.01)
*G03F 7/00* (2006.01)

(52) U.S. Cl. .................... 430/311; 430/30; 430/22; 430/296; 430/322; 430/397

(58) Field of Classification Search ................. 430/311, 430/30, 22, 296, 322, 397
See application file for complete search history.

(56) References Cited

U.S. PATENT DOCUMENTS

| 4,513,203 A | * | 4/1985 | Bohlen et al. ............ 250/491.1 |
| 4,812,661 A | * | 3/1989 | Owen ....................... 250/491.1 |
| 6,331,709 B1 | * | 12/2001 | Amemiya et al. ........ 250/491.1 |
| 6,428,940 B1 | * | 8/2002 | Sandstrom .................. 430/22 |
| 6,507,034 B1 |   | 1/2003 | Nakasugi |
| 6,765,217 B1 |   | 7/2004 | Nishimura et al. |

FOREIGN PATENT DOCUMENTS

| EP | 1 150 173 A2 | 10/2001 |
| JP | 63-263720 | 10/1988 |
| JP | 2001-85303 | 3/2001 |

* cited by examiner

*Primary Examiner*—Mark F. Huff
*Assistant Examiner*—Caleen O Sullivan
(74) *Attorney, Agent, or Firm*—Pillsbury Winthrop Shaw Pittman LLP

(57) ABSTRACT

A lithographic projection apparatus includes an alignment sensor having an electron beam source constructed and arranged to provide an electron beam for impinging on an alignment marker on a substrate, and a back-scattered electron detector constructed and arranged to detect electrons back-scattered from the alignment marker. The alignment sensor is independent of the projection system and projection radiation, and is an off-axis alignment sensor.

14 Claims, 2 Drawing Sheets

LITHOGRAPHIC APPARATUS AND DEVICE MANUFACTURING METHOD

This application is a divisional of U.S. application Ser. No. 10/356,727, filed Feb. 3, 2003, which claimed priority to European Application 02250786.7, filed Feb. 6, 2002, the entire contents of both of which are incorporated herein by reference.

BACKGROUND OF THE INVENTION

1. Field of the Invention

The present invention relates to a lithographic projection apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and 6,262,796.

Alignment is the process of positioning the image of a specific point on the mask to a specific point on the wafer that is to be exposed. For this to be achieved, the position and orientation of the wafer needs to be established, and for this purpose typically one or more alignment markers, such as a small pattern, are provided on the substrate (wafer). A device may consist of many layers that are built up by successive exposures with intermediate processing steps. Before each exposure, alignment is performed to minimize any positional error between the new exposure and the previous ones, such error being termed overlay error. However, some of the intermediate processing steps may deposit material on top of the alignment markers, and they will at least be buried under a layer of energy-sensitive material (resist), which can cause the alignment markers to be obscured which can result in overlay errors. These and other processing steps may also lead to undesired shifts of the measured aligned position.

Some lithographic projection apparatus use electron beam radiation for performing the exposures, and the electron beam is used for alignment purposes. However this suffers from the problem that the energy of the electron beam is not tailored to the alignment marker and the particular layers disposed above the marker because the beam energy is typically around 100 keV. This can result in problems of damage to the features and/or unwanted exposure of the resist during the alignment procedure, and poor contrast in observing the alignment marker.

SUMMARY OF THE INVENTION

It is an aspect of the present invention to alleviate, at least partially, the above problems.

This and other aspects are achieved according to the invention in a lithographic apparatus including a radiation system constructed and arranged to provide a projection beam of radiation; a support constructed and arranged to support a patterning device, the patterning device constructed and arranged to pattern the projection beam according to a desired pattern; a substrate table constructed and arranged to hold a substrate; a projection system constructed and arranged to project the patterned beam onto a target portion of the substrate; and an alignment sensor including an electron beam source constructed and arranged to provide an electron beam for impinging on an alignment marker on a substrate on the substrate table; and a back-scattered electron detector constructed and arranged to detect electrons back-scattered from the alignment marker, wherein the alignment sensor is independent of the radiation system of the lithographic projection apparatus but is provided within the lithographic projection apparatus to enable alignment to be performed in situ within the lithographic projection apparatus.

The present invention allows alignment to be performed using the alignment sensor even when the alignment marker is obscured or laterally shifted by a layer of resist and/or further process layers deposited on the substrate. The energy of the electron beam employed in the alignment sensor can be tailored to the particular wafer, process layers and alignment marker independently of the beam of radiation and of the radiation system and projection system.

The beam of radiation may be EUV radiation. This allows the electron beam of the alignment sensor and the beam of radiation to be independent of each other. Moreover, both the projection and the alignment system can operate in vacuum.

The electron beam and the substrate table may be scanned relative to each other. This provides a detected signal as a function of scan position indicative of the position of the alignment marker. The electron beam may be scanned relative to the substrate table, or the substrate table may be scanned relative to the electron beam.

The electron beam may be controllable to impinge on the substrate at a single spot. Alternatively, the electron beam may be controllable to impinge on the substrate at a predetermined intensity distribution having a pattern which corresponds, for example, with at least a portion of a pattern of the alignment marker on the substrate. Where this is done, a mask may be provided to pattern the electron beam, the mask being provided with a pattern which is substantially a negative of the pattern of the alignment marker on the substrate.

The electron beam source may provide electrons with an energy in the range of from 10 to 100 keV, for example in the range of from 20 to 50 keV. The electrons are thus sufficiently energetic to penetrate through any layers on top of the alignment marker before being back-scattered, but also provides good contrast in back-scattering coefficient between the substrate (e.g. silicon) and the higher atomic number material of the marker (e.g. tungsten). If the electron beam energy is too high, the contrast in back-scattering is reduced. In addition, for higher electron beam energies, the alignment unit optical column must be longer, and is thus more difficult to incorporate into the lithographic apparatus.

According to a further aspect of the present invention there is provided a device manufacturing method including providing a beam of radiation using a radiation system; patterning the beam of radiation with a pattern in its cross-section; projecting the patterned beam of radiation onto a target portion of the layer of radiation-sensitive material at least partially covering a substrate; and determining the position of the substrate prior to the projecting to align the substrate with respect to the patterned beam of radiation, by providing an electron beam independent of the beam of radiation; impinging the electron beam on an alignment marker on the substrate at a predetermined intensity distribution; and detecting electrons back-scattered from the alignment marker.

This further aspect of the invention may incorporate one or more of the preferred features referred to above.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the present invention will now be described, by way of example only, with reference to the accompanying drawings in which.

In the Figures, corresponding reference symbols indicate corresponding parts.

DETAILED DESCRIPTION

Figure 1:
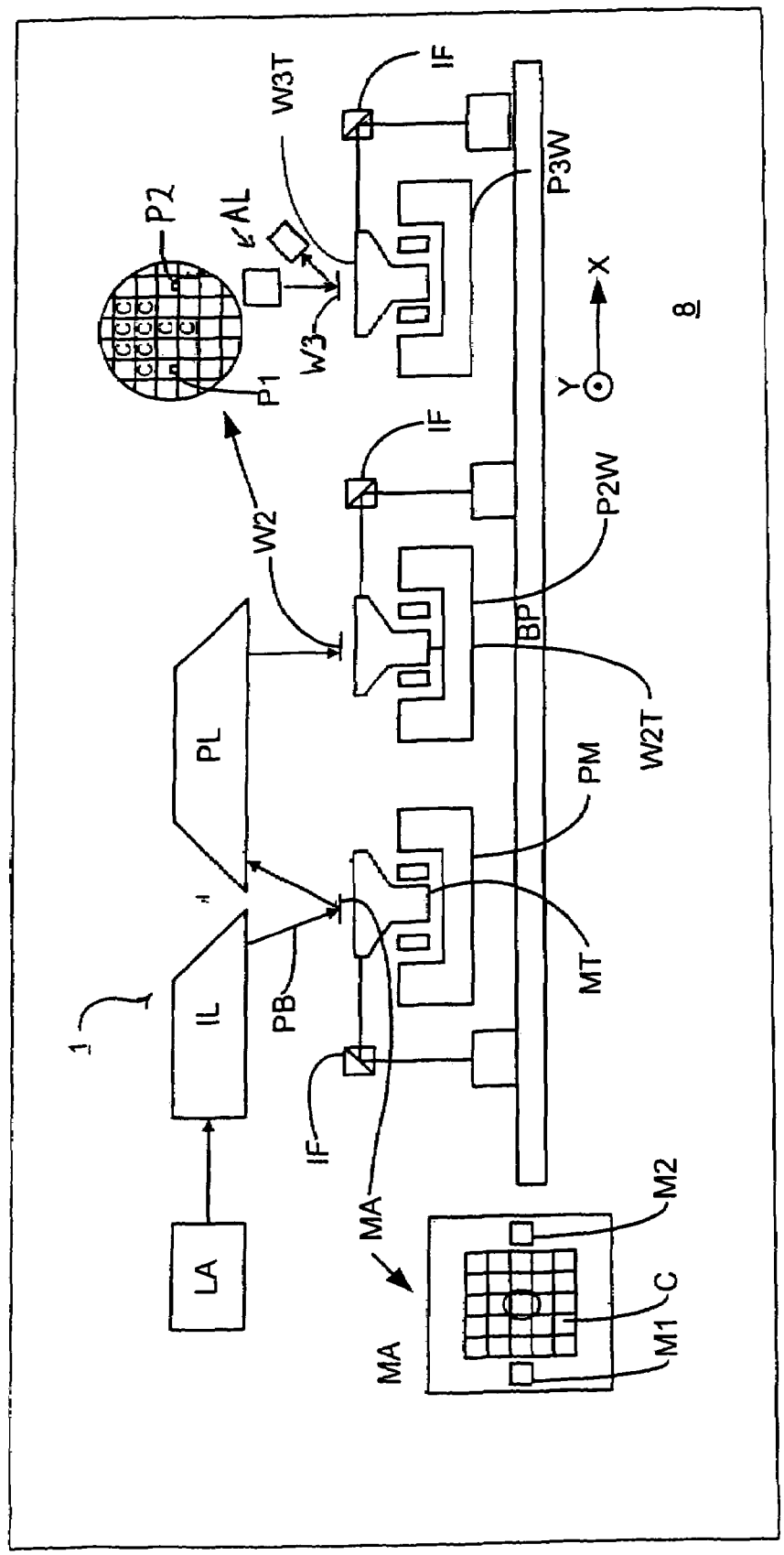
FIG. 1 depicts a lithographic projection apparatus according to an embodiment of the present invention.

FIG. 1 schematically depicts a lithographic projection apparatus 1 according to an embodiment of the invention. The apparatus 1 includes a base plate BP; a radiation system including an illumination system (illuminator) IL and a source LA that is constructed and arranged to supply a beam of radiation (e.g. an undulator or wiggler provided around the path of an electron beam in a storage ring or synchrotron, a plasma source, an electron or ion beam source, a mercury lamp or a laser). The beam is preferably an EUV beam, but may be any other suitable beam. The beam is caused to traverse various optical components included in the illuminator IL so that the resultant beam PB has a desired shape and intensity distribution in its cross section.

The projection beam PB subsequently impinges upon a mask MA which is held in a mask holder on a first object (mask) table MT that is connected to a first positioning device PM that accurately positions the mask with respect to a projection system or lens PL which focuses the projection beam PB onto a target portion C of a substrate W2 or W3 held on a second object (substrate) table W2T or a third object (substrate) table W3T, each provided with a substrate holder constructed and arranged to hold the substrate W2, W3 (e.g. a resist-coated silicon wafer), and connected to a second positioning device P2W or a third positioning P3W that accurately positions the substrates W2, W3 with respect to the lens PL. The lens PL (e.g. a mirror group) is constructed and arranged to project the patterned beam of radiation onto a target portion C (e.g. comprising one or more dies) of the substrates W2, W3.

With the aid of the second and third positioning devices P2W, P3W and interferometers IF, the substrate tables W2T, W3T can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
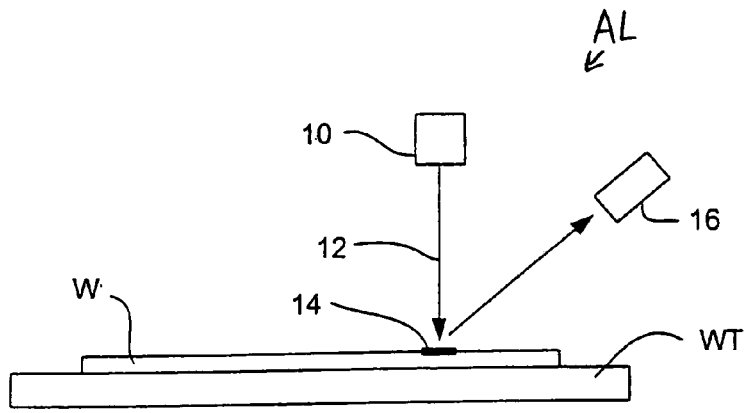
FIG. 2 is a schematic illustration of an alignment sensor, which uses an electron beam, for use in the embodiment of FIG. 1.

FIG. 2 shows the principles of an alignment system AL embodying the present invention. The alignment system AL includes an electron beam source 10 constructed and arranged to provide an electron beam 12 directed towards a wafer W supported on a wafer table WT. When the electron beam 12 impinges on a suitable alignment marker 14 on the wafer W, back-scattered electrons are generated which are detected by detector 16. Details of suitable electron beam sources 10 and back-scattered electron detectors 16 are known, for example, from the field of electron microscopy.

The back-scattering efficiency of the alignment marker 14 depends on the atomic number of the element or elements used to form the marker. It is desirable to use relatively high atomic number materials, for example, tungsten, tantalum, cobalt or titanium, although other materials may also be employed for the marker, such as copper (the silicides or nitrides of these metals may also be used). The marker may include multi-layered structures. The back-scattering efficiency, and its dependence on the electron beam position, also depend on the lateral and cross-sectional geometry of the marker. Specifically the depth, thickness, width and spatial separation of lines forming the marker, and made of high atomic number material, are factors to be considered in determining the back-scattering efficiency.

The precise position of the back-scattered electron detector 16 is not critical because the back-scattering process is not particularly directional.

The electron beam 12 is scanned relative to the wafer W. The scanning can be performed by moving the wafer table WT underneath a stationary electron beam 12, or by deflecting the electron beam 12 using electric and/or magnetic fields, or by a combination of both.

The alignment system AL enables the position and orientation of the marker 14 on the wafer W, and hence the wafer W itself, to be accurately determined with respect to the wafer table WT. Referring to FIG. 1, the alignment system AL is used to determine the position and orientation of the wafer W3 on the wafer table W3T. The wafer table W3T is then transferred, via translation of the third positioning device P3W to a location below the lens PL. This is the location occupied by the second positioning device P2W in FIG. 1 (the second positioning device P2W is translated substantially simultaneously to the location occupied by the third positioning device P3W in FIG. 1). The third positioning device P3W is aligned with respect to the beam PB. Since the position of the marker 14 (and the wafer W3) is known relative to the third positioning device P3W, this allows correct alignment of the wafer W3 with respect to the beam PB to allow an exposure to be performed.

In an alternative embodiment of the invention (not shown) the alignment system AL may be located adjacent the lens PL, so that alignment is achieved without the need to move the wafer and the positioning device to an alternative, displaced, location.

In some instances it may be preferred to provide two alignment systems, a first located as shown in FIG. 1, and a second (not shown) located adjacent the lens PL.

Determination of the marker position/orientation will be discussed in the context of further embodiments below.

The above described electron beam alignment sensor according to this embodiment of the present invention is a so-called off-axis alignment sensor because the electron beam radiation does not pass through the optical center of the lens PL. Indeed, in this embodiment of the present invention, the beam of radiation is EBV radiation and so has optics entirely independent of the electron beam alignment radiation. The electrons in the electron beam 12 generated by the electron beam source 10 have an energy set in the range of from 10 to 100 keV, and usually between 20 and 50 keV, typically around 30 keV.

Figure 3:
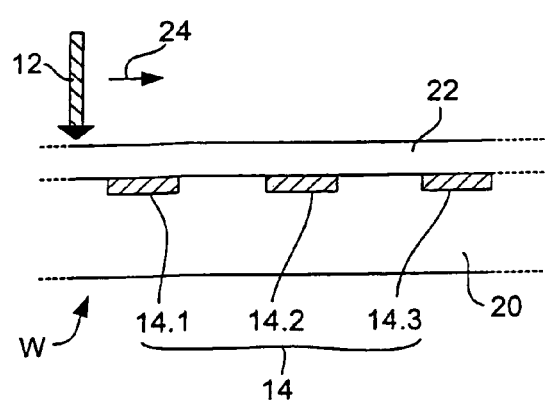
FIG. 3 is a schematic cross-section of a wafer with an alignment marker on which an electron beam is incident according to one embodiment of the present invention.

The embodiment of the present invention shown in FIG. 2 may be implemented as shown in FIG. 3. Referring to FIG. 3, an electron beam 12 is controlled to impinge on the wafer W at a single spot. In this example, the wafer W comprises a substrate 20 on which there is an alignment marker 14. The marker 14 is in the form of a periodic grating made of stripes of tungsten. Only three of the stripes 14.1, 14.2 and 14.3 are illustrated end-on in cross-section in FIG. 3. On top of the substrate 20 and the marker 14 is a layer 22 representing the resist and any process layers that have already been laid down on the wafer W. The electron beam 12 is scanned relative to the wafer W as indicated by the arrow 24 (though as mentioned above, the wafer W may alternatively be scanned in the opposite direction, or indeed both the wafer and the electron beam 12 can be moved).

Figure 4:
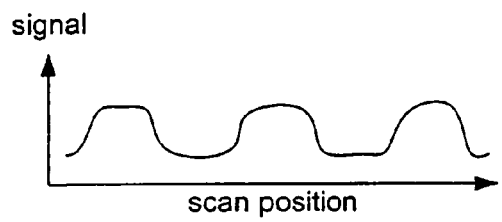
FIG. 4 depicts the back-scattered electron detection signal as the electron beam in the embodiment of FIG. 3 is scanned across the alignment marker.

The resulting signal, related to the intensity of back-scattered electrons detected by the detector 16 as a function of scan position, is shown in FIG. 4. As can be seen, there is a correspondence between the pattern of the marker 14 and the signal in FIG. 4. Although the marker 14 in FIG. 3 consists of a rectangular profile metal stripes 14.1, 14.2, 14.3, the actual signal detected by the detector 16 is the convolution of the marker pattern and the electron beam profile, so there is some smoothing in the detected signal of FIG. 4. The degree of smoothing depends on, for example, the width and profile of the electron beam 12. A further broadening of the signal, i.e. the detected back-scattered electron intensity as a function of electron beam position, occurs due to electron scattering processes in the stack. From the detected signal, the position and orientation of the marker 14 can be determined. As with optical alignment markers, several gratings may be provided, for example with different periods and for example at different orientations, in order to uniquely determine the position and orientation of the marker and hence of the wafer.

Figure 5:
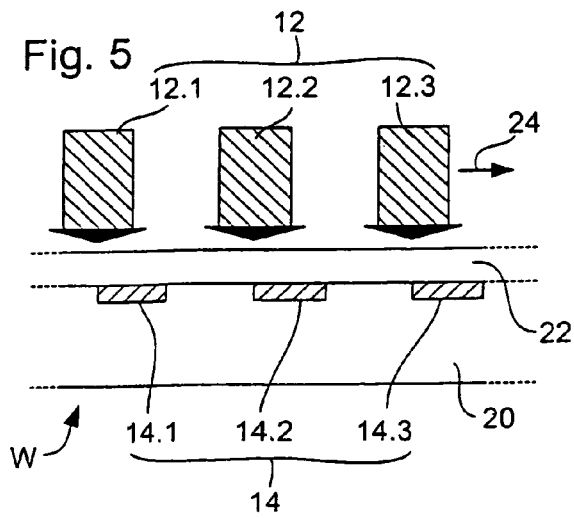
FIG. 5 is a schematic cross-section of a wafer with an alignment marker on which a patterned electron beam is incident according to another embodiment of the present invention.
Figure 6:
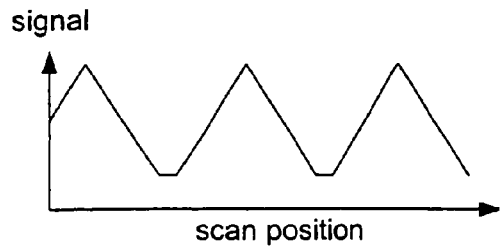
FIG. 6 depicts the back-scattered electron detection signal as the electron beam in the embodiment of FIG. 5 is scanned across the alignment marker.

In an alternative embodiment, shown in FIG. 5, the wafer structure of FIG. 3 is used, but the electron beam 12 is composed of a plurality of beamlets 12.1, 12.2, 12.3 and so on, such that the electron beam 12 is patterned in a similar way to at least a portion of the marker 14. The electron beam 12 and wafer W are scanned relative to one another as described above and the resulting detected signal from detector 16 is shown in FIG. 6. At scan positions at which there is correspondence between the pattern of the electron beam 12 and the marker 14 there is a peak in the detected signal. Again the actual detected signal is the convolution of the pattern of the marker 14 with the intensity distribution of the electron beam 12. The same comments as the embodiment above apply regarding using several gratings in the marker 14 to uniquely determine the position and orientation of the wafer W.

One way to obtain the patterned electron beam 12 according to this embodiment is to pass an initial electron beam through as mask (not shown) which is essentially a negative of the desired portion of the marker 14. The features of the mask can be defined, for example, using tungsten or other suitable material to block the electrons in particular portions of the pattern corresponding to the gaps between the features of the marker 14.

An advantage of using the electron beam to provide alignment, as compared to optical beam alignment, is that the electron beam provides alignment with respect to alignment markers that cannot be seen via an optical beam. Referring to FIG. 3, if layer 22 were to be optically opaque then it would not be possible to see the alignment markers using an optical beam. The electron beam passes directly through the optically opaque layer 22, thereby allowing alignment to be achieved.

A further advantage of using the electron beam is that scattering of the beam by the alignment markers is a function of the volume of the alignment markers not just the upper surface of the alignment markers (as is the case with optical alignment). This makes the alignment less sensitive to asymmetry of the alignment markers, as compared with optical alignment.

The invention is particularly suited to use in a lithographic apparatus which utilises EUV, since it operates well under vacuum conditions (vacuum is required for EUV to avoid absorption of the EUV by gas molecules).

While specific embodiments of the invention have been described above, it will be appreciated that the invention may be practiced otherwise than as described. The description is not intended to limit the invention.

What is claimed is:

1. A device manufacturing method, comprising:
providing a beam of radiation;
patterning the beam of radiation;
projecting the patterned beam of radiation onto a target portion of a layer of radiation-sensitive material at least partially covering a substrate; and
determining the position of the substrate prior to the projecting to align the substrate with respect to the patterned beam of radiation, by:
providing an electron beam independent of the beam of radiation;
impinging the electron beam on an alignment marker on the substrate at a predetermined intensity distribution, the electron beam propagating to the alignment marker along a path that is spaced apart from a path along which the patterned beam is projected; and detecting electrons back-scattered from the alignment marker.

2. A method according to claim 1, wherein the beam of radiation is EUV radiation.

3. A method according to claim 1, wherein the electron beam and the substrate are scanned relative to each other.

4. A method according to claim 3, wherein the substrate is fixed and the electron beam is scanned relative to the substrate.

5. A method according to claim 3, wherein the electron beam is fixed and the substrate is scanned relative to the electron beam.

6. A method according to claim 1, wherein the electron beam is comprised of a plurality of electron beamlets.

7. A method according to any claim 1, wherein the electron beam is patterned to impinge on the substrate at the predetermined intensity distribution.

8. A method according to claim 7, wherein the intensity distribution is predetermined to correspond with at least a portion of a pattern of the alignment marker on the substrate.

9. A method according to claim 8, wherein a mask is used to pattern the electron beam.

10. A method according to claim 9, wherein the mask is provided with a pattern which is substantially a negative of the pattern of the alignment marker on the substrate.

11. A method according to claim 1, wherein electrons of the electron beam have an energy in the range of 10 to 100 keV.

12. A method according to claim 1, wherein the electrons of the electron beam have an energy in the range of 20 to 50 keV.

13. A method according to claim 1, wherein the electron beam is spatially controllable such that the electron beam impinges on the alignment marker with a predetermined spatial intensity distribution.

14. A method according to claim 13, wherein the electron beam is spatially controllable without the use of the patterning device.

* * * * *